United States Patent
Yuzuriha (10) Patent No.: US 10,418,959 B2
(45) Date of Patent: Sep. 17, 2019

(54) NOISE SUPPRESSION APPARATUS, NOISE SUPPRESSION METHOD, AND NON-TRANSITORY RECORDING MEDIUM

(71) Applicant: Panasonic Intellectual Property Corporation of America, Torrance, CA (US)

(72) Inventor: Shinichi Yuzuriha, Osaka (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 0 days.

(21) Appl. No.: 15/949,372

(22) Filed: Apr. 10, 2018

(65) Prior Publication Data
US 2018/0331668 A1 Nov. 15, 2018

(30) Foreign Application Priority Data
May 15, 2017 (JP) .................................. 2017-096236

(51) Int. Cl.
| | | |
|---|---|---|
| H04B 15/00 | (2006.01) |
| H03G 3/34 | (2006.01) |
| G10L 21/0264 | (2013.01) |
| G10L 21/0208 | (2013.01) |
| G10L 19/025 | (2013.01) |
| G10L 25/12 | (2013.01) |

(52) U.S. Cl.
CPC ......... *H03G 3/345* (2013.01); *G10L 21/0208* (2013.01); *G10L 21/0264* (2013.01); *G10L 19/025* (2013.01); *G10L 25/12* (2013.01)

(58) Field of Classification Search
CPC .... H03G 3/345; G10L 21/0208; G10L 19/025

USPC .............................. 381/94.8, 94.1, 94.2, 94.4
See application file for complete search history.

(56) References Cited

U.S. PATENT DOCUMENTS

| | | | | |
|---|---|---|---|---|
| 5,878,387 A * | 3/1999 | Oshikiri | ................ | G10L 19/005 704/207 |
| 8,930,184 B2 * | 1/2015 | Sudo | ..................... | G10L 21/038 704/205 |
| 2010/0198588 A1 * | 8/2010 | Sudo | ..................... | G10L 21/038 704/205 |

FOREIGN PATENT DOCUMENTS

JP 2007-072005 3/2007

* cited by examiner

*Primary Examiner* — William J Deane, Jr.
(74) *Attorney, Agent, or Firm* — Greenblum & Bernstein, P.L.C.

(57) ABSTRACT

A noise suppression apparatus disclosed is capable of suppressing pulse noise in an input signal even in a situation in which the level of the input signal changes. The pulse noise mixed in the input signal is suppressed, and linear prediction coefficients for the input signal is derived by linear prediction analysis. A prediction residual signal is then calculated from the input signal using the linear prediction coefficient. A threshold value is calculated based on the signal level of the input signal and the signal level of the prediction residual signal is compared with the threshold value. A limit control is performed on the prediction residual signal depending on a result of the comparison, and an output signal is generated based on the prediction residual signal having been subjected to the limit control using the linear prediction coefficient.

7 Claims, 7 Drawing Sheets

NOISE SUPPRESSION APPARATUS, NOISE SUPPRESSION METHOD, AND NON-TRANSITORY RECORDING MEDIUM

BACKGROUND

1. Technical Field

The present disclosure relates to a noise suppression apparatus, a noise suppression method, and a non-transitory recording medium.

2. Description of the Related Art

Unlike stationary noise such as air conditioner blower noise, nonstationary noise such as pulse noise occurs unexpectedly and suddenly and thus it is difficult to predict when pulse noise occurs. Therefore, it is difficult to detect pulse noise and estimate a signal level of the pulse noise. For example, in a car radio receiver (a radio receiver installed in a vehicle), when degradation occurs in condition of a radio wave of a radio broadcasting being received, pulse noise may occur which may annoy listeners. In a video conference system, an operation sound of a keyboard used to input data into a computer located near a microphone can result in pulse noise, and a reproduced voice/sound output from a speaker may be very annoying.

In a conventional technique, it is known to perform linear prediction analysis on an input signal being observed, and detect pulse noise by determining a prediction residual signal. Japanese Patent No. 4413175 discloses a technique in which a measurement is performed to detect the number of sample points at which the absolute value of the amplitude of a prediction residual signal in each of sub-frames of a frame with a fixed time width is larger than a threshold value and existence of pulse noise in the frame is detected based on the largest measured number in the frame.

SUMMARY

Although Japanese Patent No. 4413175 discloses the method of detecting noise, nothing is described about a method of detecting noise adaptively depending on a change in the signal level of the input signal and nothing is described about a method of removing noise adaptively depending on a change in the signal level of the input signal.

One non-limiting and exemplary embodiment provides a noise suppression apparatus capable of suppressing pulse noise mixed in an input signal even in a situation in which the level of the input signal changes. Another non-limiting and exemplary embodiment provides a noise suppression method for properly suppressing pulse noise included in an input signal. Still another non-limiting and exemplary embodiment provides a non-transitory recording medium storing thereon a computer program for properly suppressing pulse noise included in an input signal.

In one general aspect, the techniques disclosed here feature a noise suppression apparatus that suppresses pulse noise mixed in an input signal, including an analyzer that derives linear prediction coefficients by linear prediction analysis on the input signal, a residual calculator that calculates a prediction residual signal indicating a difference from a result of the linear prediction, from the input signal using the linear prediction coefficients, a threshold value calculator that calculates a threshold value based on a signal level of the input signal, a judger that compares a signal level of the prediction residual signal with the threshold value, a limit controller that performs a limit control on the prediction residual signal depending on a result of the comparison, and a reproducer that generates an output signal using the linear prediction coefficients based on the prediction residual signal having been subjected to the limit control.

According to the present disclosure, it is possible to properly suppress pulse noise in an input signal even in a situation in which the level of the input signal changes.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

In an aspect, the present disclosure provides a noise suppression apparatus that suppresses pulse noise mixed in an input signal, including an analyzer that derives linear prediction coefficients by linear prediction analysis on the input signal, a residual calculator that calculates a prediction residual signal indicating a difference from a result of the linear prediction, from the input signal using the linear prediction coefficients, a threshold value calculator that calculates a threshold value based on a signal level of the input signal, a judger that compares a signal level of the prediction residual signal with the threshold value, a limit controller that performs a limit control on the prediction residual signal depending on a result of the comparison, and a reproducer that generates an output signal using the linear prediction coefficients based on the prediction residual signal having been subjected to the limit control. The limit control is a control to suppress the signal level under a particular condition such that the limit control is performed depending on a result of the comparison between the signal level of the prediction residual signal and the threshold value based on the signal level of the input signal thereby properly suppressing pulse noise included in the input signal even when a change occurs in the level of the input signal. As a result of performing the limit control, the output signal is generated based on the prediction residual signal obtained as a result of suppressing pulse noise, and thus an adverse effect on the voice/sound is suppressed, and pulse noise is removed from the reproduced voice/sound.

The limit controller may perform the limit control such that in a case where the result of the comparing indicates that the signal level of the prediction residual signal is larger than the threshold value, the prediction residual signal is suppressed, while in a case where the result of the comparing indicates that the signal level of the prediction residual signal is not larger than the threshold value, the prediction residual signal is not suppressed. That is, the noise suppression by the noise suppression apparatus may be performed only during a period in which the input signal includes pulse noise, which makes it possible to efficiently perform the noise suppression.

The input signal may be a time-series signal including signal data at each of sample points, and the residual calculator may calculate the prediction residual signal as the time-series signal including signal data at each of sample points. In the judger, in a case where the result of the comparing indicates that the signal level of the prediction residual signal at a first sample point subjected to the comparison is not larger than the threshold value, a second sample point immediately following the first sample point may be employed as a next sample point to be subjected to the comparing, while in a case where the result of the comparing indicates that the signal level of the prediction residual signal at the first sample point subjected to the comparison is larger than the threshold value, a third sample point located a predetermined number of samples after the first sample point may be employed as a next sample point to be subjected to the comparing. In the limit controller, in a case where the result of the comparison by the judger on the prediction residual signal at the first sample point indicates that the signal level of the prediction residual signal is larger than the threshold value, the limit controller may perform the suppression on the prediction residual signal at least for sample points including the first sample point and as many sample points following the first sample point as a number equal to the predetermined number minus 1. The pulse noise suppression is performed at a time for sample points in a period in which putative existence of pulse noise is detected and thus an improvement in processing efficiently is achieved, and a reduction in processing cost is achieved.

The threshold value that is compared, in the comparing by the judger, with the signal level of the prediction residual signal at a sample point of interest may be a threshold value calculated based on the average value of signal levels at a plurality of successive sample points including the sample point of interest of the input signal. Thus, the threshold value is dynamically determined, and pulse noise is correctly detected based on the result of the comparison using the threshold value. Therefore, it is possible to efficiently remove pulse noise by performing the limit control.

The threshold value calculator may calculate the threshold value based on the ratio between the signal level of the input signal and the signal level of the prediction residual signal. This makes it possible to properly detect pulse noise from the result of the comparison based on the threshold value without depending on either the magnitude of the signal level of the input signal or the magnitude of the signal level of the prediction residual signal. By performing the limit control on the prediction residual signal over a detected interval, it is possible to efficiently remove pulse noise.

In an aspect, the present disclosure provides a noise suppression method for suppressing pulse noise mixed in an input signal, including deriving linear prediction coefficients by linear prediction analysis on the input signal, calculating a prediction residual signal indicating a difference from a result of the linear prediction, from the input signal using the linear prediction coefficients, calculating a threshold value based on a signal level of the input signal, comparing a signal level of the prediction residual signal with the threshold value, performing a limit control such that in a case where the result of the comparing indicates that the signal level of the prediction residual signal is larger than the threshold value, the prediction residual signal is suppressed, while in a case where the result of the comparing indicates that the signal level of the prediction residual signal is not larger than the threshold value, the prediction residual signal is not suppressed, and generating an output signal based on the prediction residual signal having been subjected to the limit control using the linear prediction coefficient. In this method, the suppression of the prediction residual signal is performed when the result of the comparison indicates that the signal level of the prediction residual signal is larger than the threshold value based on the signal level of the input signal, and thus the output signal is generated such that the pulse noise is properly suppressed depending on the level of the input signal.

In an aspect, the present disclosure provides a program, which when executed by a microprocessor provided in a noise suppression apparatus, causes the microprocessor to perform a noise suppression process to suppress a pulse noise included in an input signal, the noise suppression process including deriving linear prediction coefficients by linear prediction analysis on the input signal, calculating a prediction residual signal indicating a difference from a result of the linear prediction, from the input signal using the linear prediction coefficients, calculating a threshold value based on a signal level of the input signal, comparing a signal level of the prediction residual signal with the threshold value, performing a limit control such that in a case where the result of the comparing indicates that the signal level of the prediction residual signal is larger than the threshold value, the prediction residual signal is suppressed, while in a case where the result of the comparing indicates that the signal level of the prediction residual signal is not larger than the threshold value, the prediction residual signal is not suppressed, and generating an output signal based on the prediction residual signal having been subjected to the limit control using the linear prediction coefficient. By causing the processor of the apparatus to execute the program, it becomes possible to generate an output signal such that the pulse noise is properly suppressed depending on the level of the input signal.

It should be noted that general or specific embodiments may be implemented as a system, a method, an integrated circuit, a computer program, a computer-readable storage medium such as CD-ROM, or any selective combination thereof.

The noise suppression apparatus using the noise suppression method according to an embodiment is described below with reference to drawings. Note that each embodiment described below is merely for illustrating a specific example of the present disclosure. Therefore, in the following embodiments, values, constituent elements, locations of elements, manners of connecting elements, elements in processes such as steps, the order of steps, and the like are described by way of example but not limitation. Among constituent elements described in the following embodiments, those constituent elements that are not described in independent claims of the present disclosure are optional. Note that each drawing is a schematic diagram, which does not necessarily provide a strict description.

First Embodiment

An embodiment is described below taking as an example a noise suppression apparatus 10. The noise suppression apparatus 10 is an apparatus that operates such that when a voice/sound signal including pulse noise is given as an input signal, an output signal is generated such that the pulse noise in the input signal is suppressed to a low level. The noise suppression apparatus 10 may be used as a stand along apparatus or may be embedded in, for example, a car radio receiver, a sound collector, an audio device, or the like.

Figure 1:
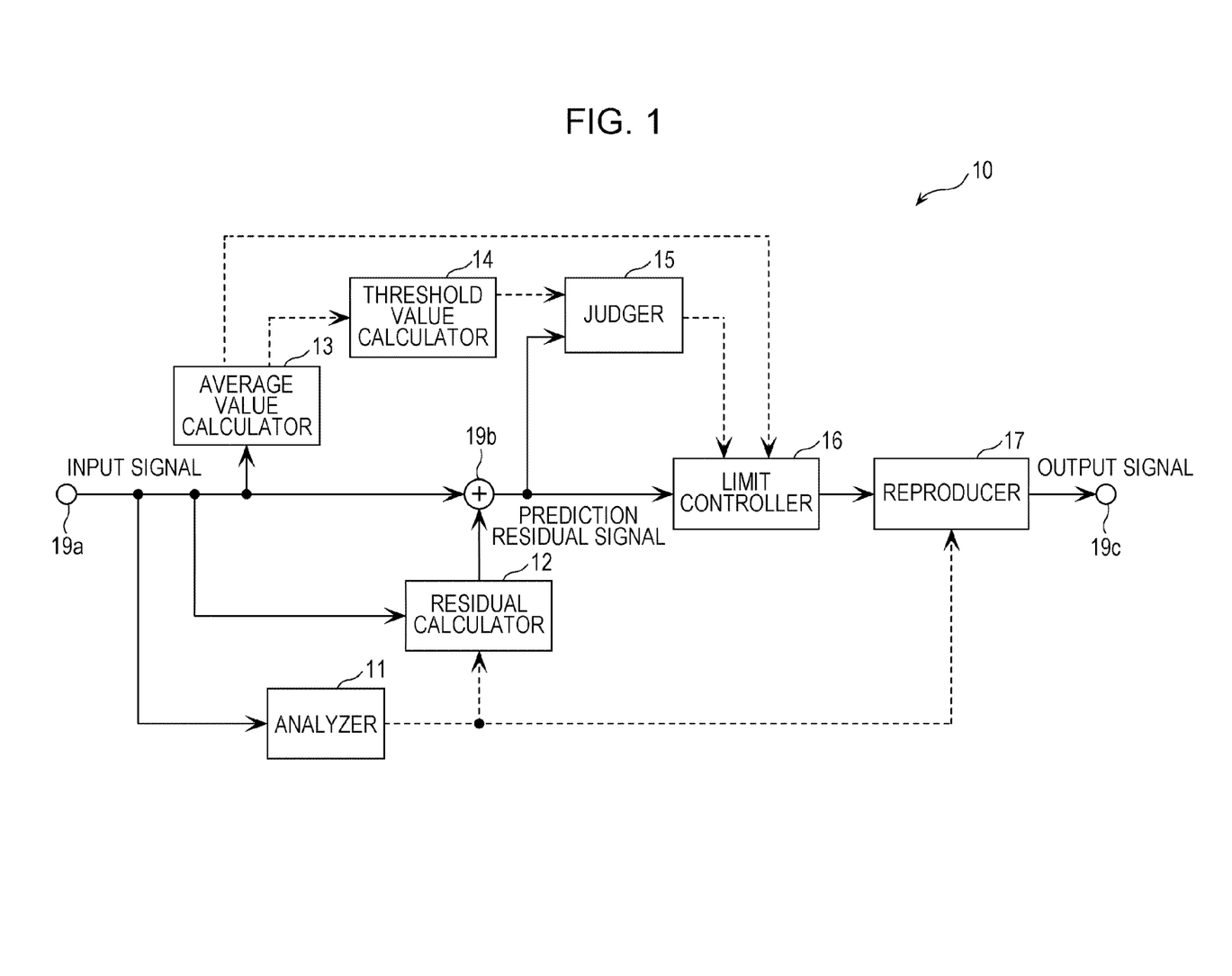
FIG. 1 is a block diagram illustrating a configuration of a noise suppression apparatus according to a first embodiment.

FIG. 1 is a block diagram illustrating a configuration of the noise suppression apparatus 10. The noise suppression apparatus 10 includes, as shown in FIG. 1, an analyzer 11, a residual calculator 12, an average value calculator 13, a threshold value calculator 14, a judger 15, a limit controller 16, and a reproducer 17. To show a flow of a signal in the noise suppression apparatus 10, FIG. 1 also illustrates input/output nodes and the like such as an input node 19a at which an input signal is input, a node 19b at which a prediction residual signal output from the residual calculator 12 appears, and an output node 19c from which an output signal is output.

The input signal is a voice/sound signal which may include pulse noise. An example of an input signal is a digital signal in the form of a time-series signal including samples (signal data) obtained by being sampled at respective sample points at a particular sampling frequency (for example, 16 kHz). The input signal in the form of a time-series signal may include a silent period in which no voice/sound appears in addition to a voice/sound period in which voice/sound appears. In time domain, sample points exist at sampling intervals. In the noise suppression apparatus 10, for example, using a buffer capable of storing a particular amount of signal data, each piece of signal data of the input signal given in the form of a time-series signal is sequentially stored in the buffer such that the data is temporarily stored therein. When the signal data is in the buffer, it is allowed to access the signal data stored in the buffer and perform processing on the signal data. For example, the noise suppression apparatus 10 may delay the sequentially given input signal and may sequentially output a resultant signal with the introduced particular delay.

The analyzer 11 performs linear prediction analysis on the input signal thereby deriving linear prediction coefficients. More specifically, the analyzer 11 derives P-dimensional linear prediction coefficients shown in equation (1) such that the linear prediction residual is minimized, where P is, for example, 14.

$$\text{linear prediction coefficients } a=[a(1),\ldots,a(P)]^T \quad (1)$$

When the input signal is expressed as a time-series signal x(t) at sampling points t (t=0, 1, 2, ... ) in time domain, a predicted signal obtained as a result of the linear prediction performed by the analyzer 11 is given by equation (2). Note that in the linear prediction, the predicted signal is determined such that the prediction error given as a result of adding the predicted signal to the input signal is minimized.

$$\text{predicted signal} \hat{x}(t) = \sum_{i=1}^{P} a(i)x(t-i) \quad (2)$$

The residual calculator 12 calculates a prediction residual signal from the input signal using the linear prediction coefficients derived by the analyzer 11. More specifically, as shown in equation (3), the residual calculator 12 calculates the prediction residual signal ε(t) using the input signal x(t) and the predicted signal given by equation (2).

$$\text{prediction residual signal } \varepsilon(t)=x(t)+\hat{x}(t) \quad (3)$$

In the linear prediction, the predicted signal is determined such that the prediction error given by the result of the sum of the input signal and the predicted signal is minimized, and thus the prediction residual signal ε(t) indicates the difference between the input signal x(t) and the result of the linear prediction.

The average value calculator 13 calculate the average signal level of the input signal. More specifically, the average value calculator 13 calculates the average signal level $X_{LV}$ from the input signal x(t) according to equation (4). The signal level corresponds to the magnitude of the amplitude of a signal waveform of the input signal, that is, the signal level indicates the magnitude of the signal data or the absolute value of the signal data.

$$\text{average signal level } X_{LV} = \frac{1}{M}\sum_{t=0}^{M-1} |x(t)| \quad (4)$$

The average signal level $X_{LV}$ is given by the moving average of M signal levels, that is, the average of absolute values of signal levels of signal data at M sampling points, where M is an arbitrary number equal to or greater than 2, for example, M=10.

The threshold value calculator 14 dynamically calculates a threshold value for use in detecting pulse noise, based on the input signal level. More specifically, for example, the threshold value calculator 14 calculates, as shown in equation (5), the threshold value based on the average signal level $X_{LV}$ of the input signal calculated by the average value calculator 13.

$$\text{threshold value } Lv_{TH} = \alpha \cdot X_{LV} + (1-\alpha) \cdot Lv_{TH}$$
$$\alpha = \begin{cases} \alpha_1 & Lv_{TH} > X_{LV} \\ \alpha_2 & Lv_{TH} \leq X_{LV} \end{cases} \quad (5)$$

In equation (5), α is a time constant gain which takes a value of $\alpha_1$ or $\alpha_2$ ($\alpha_1 > \alpha_2$). The time constant gain may be adjusted in advance such that the threshold value has a proper value. The condition $\alpha_1 > \alpha_2$ is imposed on a to adjust the signal level to a lower level.

Note that when a signal has periodicity as with a voice/sound signal, a music signal, or the like, the prediction by the linear prediction analysis has a small error and the signal level of the prediction residual signal calculated by the residual calculator 12 has a relatively small value. However, when the input signal is a mixture of a signal such as a voice signal or a music signal and pulse noise, the signal level of the voice/sound signal or the music signal is large compared with that of the pulse noise. Therefore, in a case where the signal level of the input signal is generally large, the signal level of the voice/sound signal, the music signal, or the like in the calculated prediction residual signal can be rather large. Therefore, for example, if the threshold value calculator 14 calculates the threshold value only from the simple average value of signal levels of the prediction residual signal, then a detection error of pulse noise tends to easily occur. In contrast, in the above-described calculation of the threshold value by the threshold value calculator 14 according to the present embodiment, the threshold value used in detecting pulse noise is adaptively changed depending on the average signal level of the input signal, and thus the use of this threshold value is useful in that it becomes possible to reduce the probability of erroneous detection of pulse noise compared with a method in which the threshold value is calculated simply based on only the average signal level of the prediction residual signal or compared with a method in which a fixed value is simply employed as the threshold value.

The judger 15 judges whether the input signal includes pulse noise. To make this judgment, the judger 15 compares the signal level of the prediction residual signal with the threshold value. More specifically, the judger 15 compares the signal level $|\varepsilon(t)|$ of the prediction residual signal $\varepsilon(t)$ calculated by the residual calculator 12 with the threshold value calculated by the threshold value calculator 14 (see equation (5)) for one sample at each sampling point. When the signal level $|\varepsilon(t)|$ of the prediction residual signal is larger than the threshold value, it is determined that pulse noise is detected, while when the signal level $|\varepsilon(t)|$ of the prediction residual signal is not larger than the threshold value, it is determined that the signal is not pulse noise. The threshold value used by the judger 15 in comparing with the signal level of the prediction residual signal of signal data at one sample point is a threshold value calculated based on the average value of signal levels of signal data at M successive sample points including signal data at the sample point of interest of the input signal.

The limit controller 16 performs the limit control on the prediction residual signal calculated by the residual calculator 12 depending on the result of the judgement by the judger 15 (that is, depending on the result of the comparison of the signal level of the prediction residual signal with the threshold value). More specifically, the limit controller 16 performs the limit control such that in a case where the judger 15 determines that the input signal includes no pulse noise, the prediction residual signal is directly output, while in a case where the judger 15 determines that the input signal includes pulse noise, the prediction residual signal is suppressed such that the signal level thereof falls within a particular range, and a resultant suppressed prediction residual signal is output.

Figure 2:
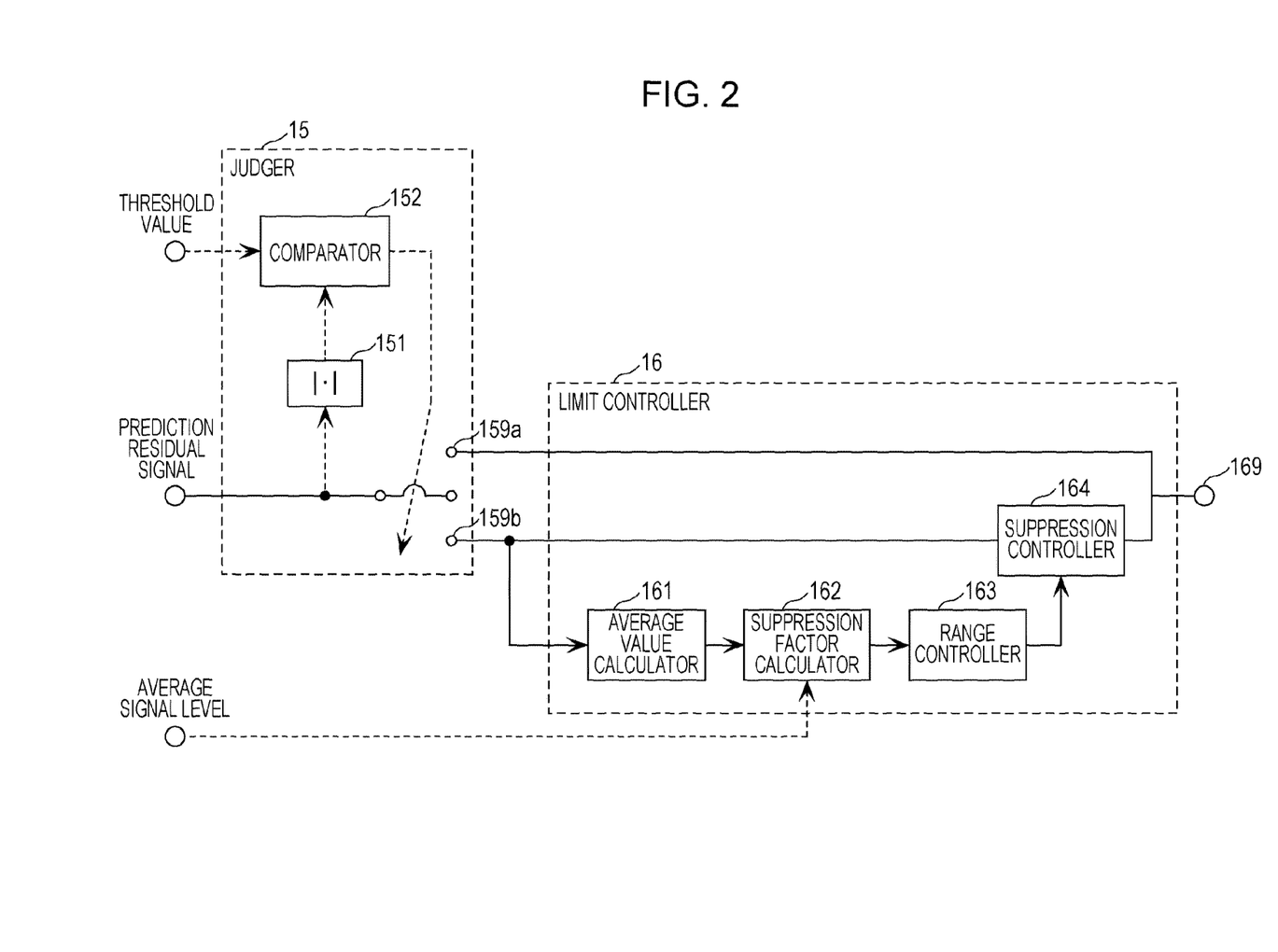
FIG. 2 is a block diagram illustrating an example of a configuration of a judger and an example of a configuration of a limit controller of a noise suppression apparatus.

FIG. 2 illustrates an example of a configuration of the judger 15 and an example of a configuration of the limit controller 16. The judger 15 includes a signal level calculator 151 that calculates a signal level, in absolute value, of the prediction residual signal and also includes a comparator 152 that compares the signal level of the prediction residual signal with the threshold value. In the example shown in FIG. 2, in a case where the result of the comparison by the comparator 152 indicates that the signal level of the prediction residual signal is larger than the threshold value, the prediction residual signal input to the judger 15 is transferred to the input node 159a of the limit controller 16, while in a case where the signal level of the prediction residual signal is not larger than the threshold value, the prediction residual signal input to the judger 15 is transferred to the input node 159b of the limit controller 16.

The limit controller 16 includes an average value calculator 161, a suppression factor calculator 162, a range controller 163, and a suppression controller 164. In the limit controller 16, the prediction residual signal received at the input node 159a is directly supplied to node 169 connected to the reproducer 17, while the prediction residual signal received at the input node 159b is supplied to the node 169 after being suppressed by the suppression controller 164.

The average value calculator 161 calculates, according to equation (6), the average value q of the signal levels of the prediction residual signals at sample points of signal data over a range from $L_{ST}$ samples before the sample point of interest to $L_{END}$ samples after the sample point of interest.

$$\text{average value } q = \frac{1}{L_{ST} + L_{END}} \sum_{k=0}^{L_{ST}+L_{END}-1} |\varepsilon(t)| \qquad (6)$$

The suppression factor calculator 162 calculates a suppression factor g using the average value q calculated by the average value calculator 161 and the average value $X_{LV}$ of the signal levels of the input signal calculated by the average value calculator 13, according to equation (7).

$$\text{suppression factor } g = \frac{\beta \cdot X_{LV}}{q} \qquad (7)$$

where $\beta$ is a weighting factor for adjusting the degree of suppression.

The range controller 163 limits the suppression factor g calculated by the suppression factor calculator 162 using a maximum value and a minimum value. More specifically, the range controller 163 calculates the suppression factor g within a range from a predetermined lower limit $g_{MIN}$ to 1 as shown in equation (8).

$$\text{limited suppression factor } \begin{array}{l} g = \text{MAX}(g, g_{MIN}) \\ g = \text{MIN}(g, 1.0) \end{array} \qquad (8)$$

where MAX( ) is a function that returns a value equal to the greater one of two arguments, and MIN( ) is a function that returns a value equal to the smaller one of two arguments.

The suppression controller 164 suppresses the signal level of the prediction residual signal using the suppression factor g calculated by the range controller 163.

More specifically, as shown in equation (9), the suppression controller 164 multiplies the signal data of the prediction residual signal by the suppression factor g for each of all prediction residual signals in the range from $L_{ST}$ samples before a sample at which pulse noise is detected to $L_{END}$ samples after the sample at which pulse noise.

$$\text{suppressed prediction residual signal } \hat{\varepsilon}(t) = g \cdot \varepsilon(t) \\ t = L_{ST}, \ldots, L_{END} - 1 \qquad (9)$$

where $L_{ST}$ and $L_{END}$ are arbitrarily determined values. For example, $L_{ST}$ may be equal to 5, and $L_{END}$ may be equal to 5. Note that $L_{END}$ may be equal to 0.

In the above-described manner, when pulse noise is detected at a sample point of interest, the limit controller 16 suppresses the signal data over a period from $L_{ST}$ samples before the sample point of interest to $L_{END}$ samples after the sample point of interest. However, in a case where all pieces of signal data of sample points in a range from the sample point of interest to the $L_{END}$ samples after the sample of interest are not included in the signal data of sample points stored in the buffer, the limit controller 16 reduces the range of data to be subjected to the suppression such that all pieces of signal data are found in the buffer. The judger 15 makes the judgment at each sample point. However, in a case where the result of judgement at one sample at a sample point t indicates that pulse noise exists there, that is, in a case where the result of the judgement indicates that the limit control is to be performed, the judger 15 starts a next judgment at a sample point $t+L_{END}$ samples after the point at which the pulse noise is detected. In other words, in a case where the comparison result indicates that the signal level of a prediction residual signal at a certain one sample point is larger than the threshold value, the judger 15 performs the next comparison at a sample point $L_{END}$ points after the certain one sample point. On the other hand, in a case where the comparison result indicates that the signal level of a prediction residual signal at a sample point of interest is not larger than the threshold value, the next comparison is performed at a sample point immediately following the sample point of interest. In a case where the result of the comparison by the judger 15 indicates that the signal level of the prediction residual signal at a sample point of interest is larger than the threshold value, the limit controller 16 performs the suppression at least on the prediction residual signal at this sample point of interest and as many prediction residual signals as $L_{END}-1$ at sampling points following the sample point of interest. As a result, the suppression of the prediction residual signals by the limit controller 16 is performed in an efficient and proper manner.

The reproducer 17 reproduces the original signal by using the suppressed prediction residual signal. The original signal corresponds to an input signal including no pulse noise.

Figure 3:
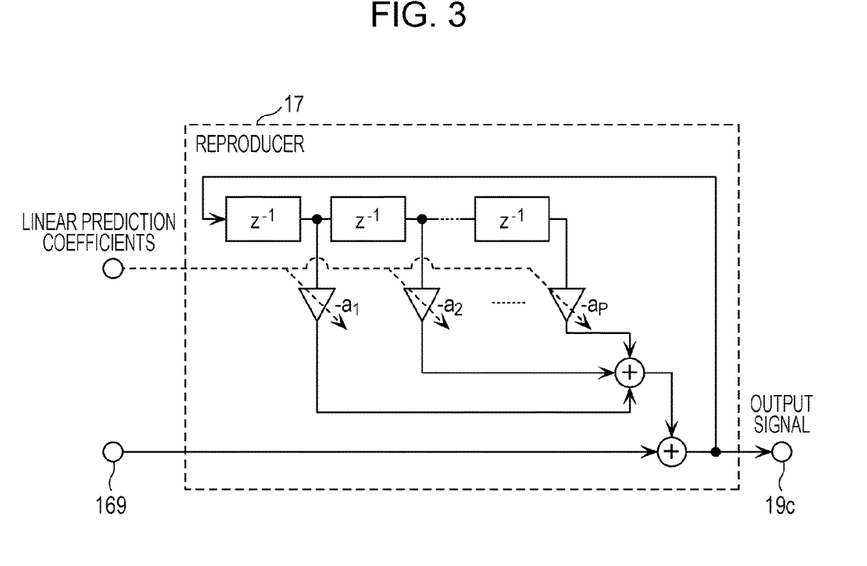
FIG. 3 is a diagram illustrating an example of a configuration of a reproducer of a noise suppression apparatus.

FIG. 3 illustrates an example of a configuration of the reproducer 17. In FIG. 3, $Z^{-1}$ denotes an operator that creates a delay with a length corresponding to the interval between two sample points to occur on a signal.

Using an inverse filter based on the linear prediction coefficient derived by the analyzer 11, the reproducer 17 for reproducing the original signal generates an output signal corresponding to the input signal in which the pulse noise is suppressed based on the prediction residual signal which is supplied to the node 169 after being suppressed via the limit control by the limit controller 16, and the reproducer 17 outputs the resultant output signal to the output node 19c. Note that if no suppression is performed on the prediction residual signal, the output signal generated using the inverse filter is identical to the input signal.

To express the output signal in the form of a time-series signal y(t) at a sample point t (t=0, 1, 2, ...) in time domain, the reproducer 17 calculates the output signal y(t) according to equation (10) using the P-dimensional linear prediction coefficient shown in equation (1) and the suppressed prediction residual signal shown in equation (9).

$$\text{output signal} \, y(t) = \hat{\varepsilon}(t) - \sum_{i=1}^{P} a(i) y(t-i) \quad (10)$$

Because the pulse components of the prediction residual signal are suppressed according to equation (9), the reproduced output signal y(t) does not include pulse components, that is, the obtained output signal no longer includes pulse noise.

Experimental Results

Experimental results obtained for the noise suppression apparatus 10 installed as a car radio receiver are described below.

Figure 4A:
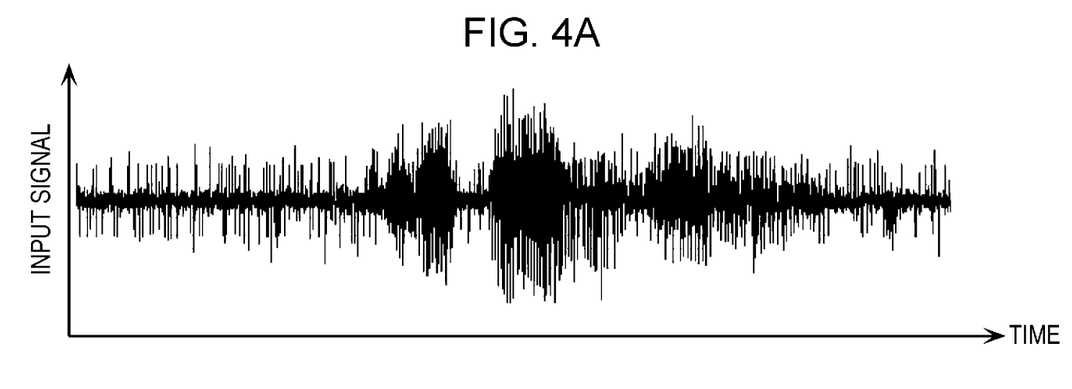
FIG. 4A is a diagram illustrating an example of an input signal and an example of a prediction residual signal in a noise suppression apparatus.
Figure 4B:
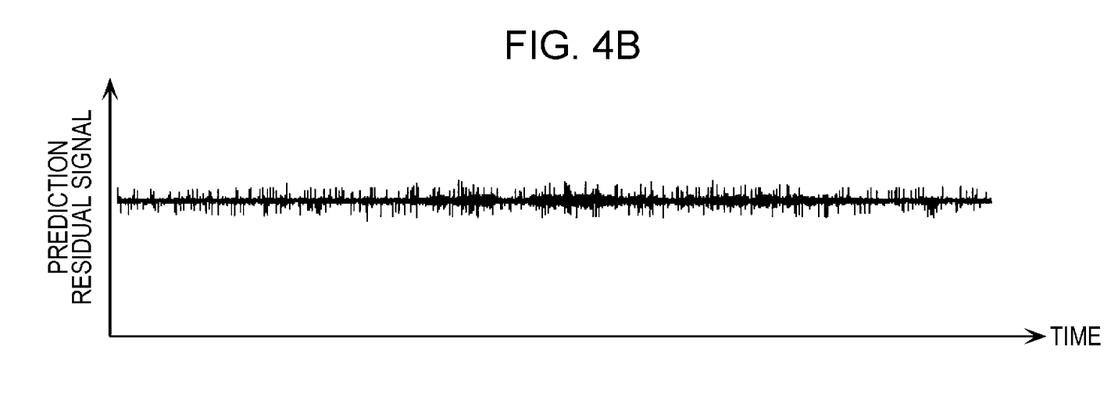
FIG. 4B is a diagram illustrating an example of an input signal and an example of a prediction residual signal in a noise suppression apparatus.

Each of FIGS. 4A and 4B illustrates an example of an input signal and an example of a prediction residual signal in the noise suppression apparatus 10. FIG. 4A shows an input signal which is a mixture of a voice/sound signal and pulse noise, while FIG. 4B shows a prediction residual signal corresponding to this input signal where a middle range in amplitude in a vertical direction corresponds to a minimum signal level.

In the linear prediction analysis performed by the analyzer 11, linear prediction coefficients are derived by estimating linear prediction coefficients such that a sample value (that is, a signal data value) of one sample point at a current time in the input signal in the form of time-series signal can be predicted by a linear combination of sample values in the past. Thus, the stronger periodicity the sample values in the past have, the higher accuracy the estimation has. In a case where no periodicity exists, it is difficult to make prediction using past sample values, and the estimation accuracy is low. Thus, a small estimation error is achieved for a signal having a good periodicity such as a voice/sound signal, a music signal, or the like. However, for a signal that occurs unexpectedly or randomly as with pulse signals, the estimation error is large compared with that obtained for voice/sound signals or the like. As can be seen from FIG. 4B, although the voice/sound signal is small in the prediction residual signal calculated by the residual calculator 12, the pulse signal remains as a relatively large signal in the prediction residual signal. The pulse signal in a voice/sound period in which a voice/sound was uttered is also remains as a relatively large signal, which means that it is possible to efficiently detect pulse noise in the voice/sound period.

Figure 5A:
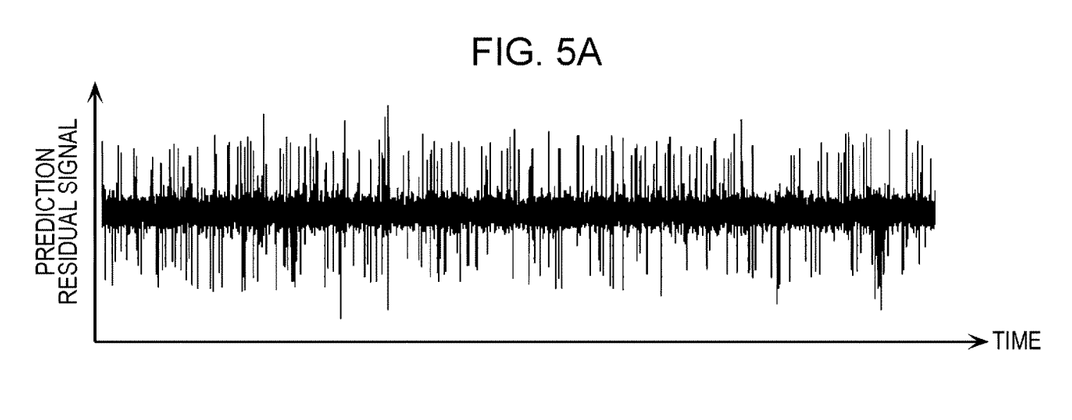
FIG. 5A is a diagram illustrating an example a prediction residual signal and an example of a signal obtained after limit control is performed in a noise suppression apparatus.
Figure 5B:
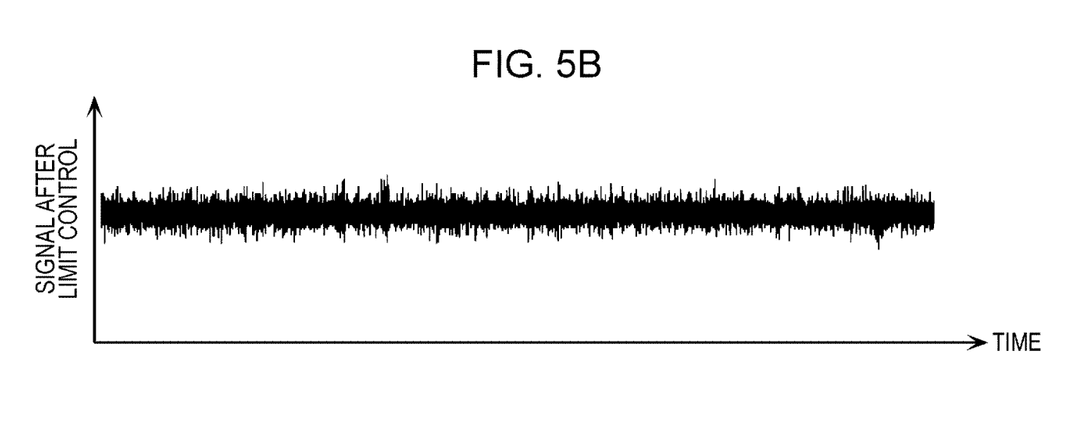
FIG. 5B is a diagram illustrating an example a prediction residual signal and an example of a signal obtained after limit control is performed in a noise suppression apparatus.

Each of FIGS. 5A and 5B illustrates an example of a prediction residual signal and an example of a signal obtained after limit control is performed in the noise suppression apparatus 10. FIG. 5A shows a prediction residual signal before the limit control is performed by the limit controller 16, and FIG. 5B shows a prediction residual signal after the limit control is performed. Note that the prediction residual signal shown in FIG. 5A is the same as the prediction residual signal shown in FIG. 4B, but it is expanded in the vertical direction in FIG. 5A. The pulse signal included in the prediction residual signal is large in amplitude, and thus it is possible to suppress pulse signal components by suppressing the signal with a large amplitude by the limit control.

Figure 6A:
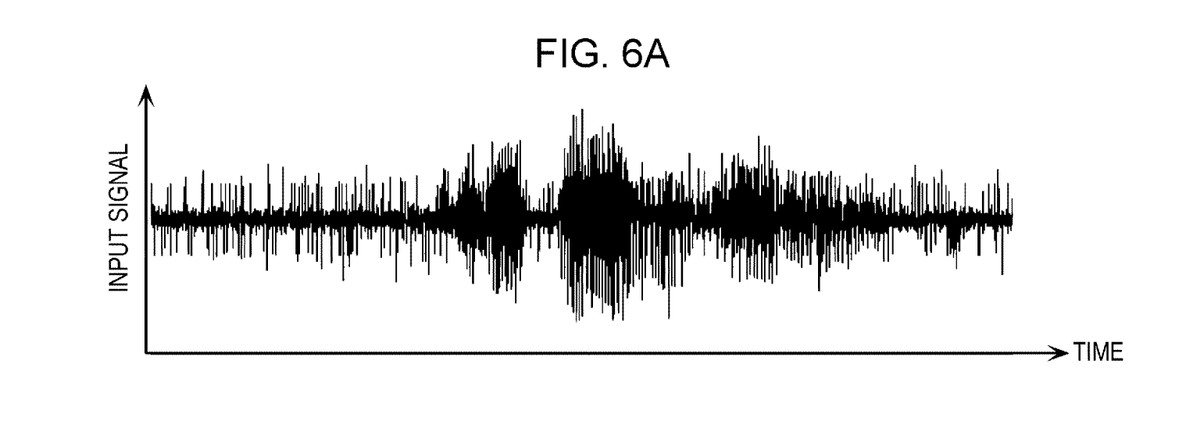
FIG. 6A is a diagram illustrating an example of an input signal and an example of an output signal in a noise suppression apparatus.
Figure 6B:
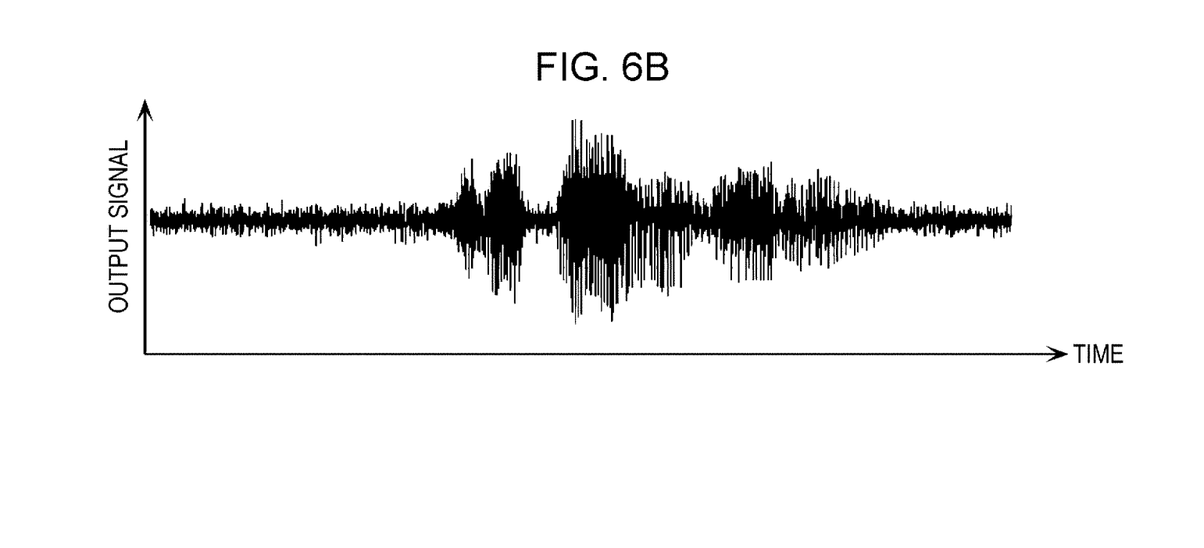
FIG. 6B is a diagram illustrating an example of an input signal and an example of an output signal in a noise suppression apparatus.

Each of FIGS. 6A and 6B illustrates an example of an input signal and an example of an output signal in the noise suppression apparatus 10. In the example shown in FIG. 6A, the input signal is a mixture of a voice/sound signal and pulse noise. FIG. 6B illustrates the output signal output by the noise suppression apparatus 10. As shown in FIG. 6B, the voice/sound waveform of the input signal remains in the output signal, but the pulse signal components of pulse noise are deleted.

Other Embodiments

The embodiments of the disclosure have been described above as examples of the technique of the present disclosure. However, the technique of the present disclosure is not limited to those embodiments described above, but modifications, replacements, additions, removals, or the like are possible. Note that such modifications also fall within the scope of the present disclosure. Some examples of modifications are described below.

(1) In the embodiments described above, it is assumed by way of example that the threshold value calculator 14 calculates the threshold value for use in detecting pulse noise, using the average signal level of the input signal. Alternatively, the threshold value calculator 14 may calculate the threshold value using both the signal level of the input signal and the signal level of the prediction residual signal. More specifically, for example, the threshold value calculator 14 may calculate the threshold value based on the ratio between the signal level of the input signal and the signal level of the prediction residual signal.

(2) The noise suppression apparatus 10 according to the embodiment described above may be implemented, for example, by a digital circuit or an analog circuit including an integrated circuit such as a memory, a processor (a microprocessor) and the like. Functions of respective constituent elements of the implementation of the noise suppression apparatus 10 may be realized by software by executing a program stored in the memory by the processor, or may be realized by dedicated hardware (digital circuits or the like) without using the program. Each constituent element (for example, each block shown in FIG. 1) of the noise suppression apparatus 10 may be implemented by a digital circuit or an analog circuit, or a mixture of a plurality of constituent elements may be implemented by a single circuit. The functions of the respective constituent elements in the noise suppression apparatus 10 may be changed.

(3) Part or all of the constituent elements of the noise suppression apparatus 10 according to the embodiment described above may be implemented in a single system LSI (Large Scale Integration). The system LSI is a super-multifunction LSI produced such that a plurality of parts are integrated on a single chip. More specifically, the system LSI is a computer system including a microprocessor, a ROM, a RAM, and so on. A computer program is stored in the RAM. In the system LSI, the microprocessor operates according to the computer program thereby achieving the function of the system LSI. Each of the constituent elements of each apparatus described above may be integrated separately on a single chip, or part of all of the apparatus may be integrated on a single chip. The system LSI may also be referred to as an IC, an LSI, a super LSI, or an ultra LSI depending on the degree of integration. Furthermore, the technique of implementing the integrated circuit is not limited to the LSI, but the integrated circuit may be realized in the form of a dedicated circuit or a general-purpose processor. The integrated circuit may also be realized using an FPGA (Field Programmable Gate Array) that can be programmed after the manufacture of the LSI or a reconfigurable processor that is allowed to be reconfigured in terms of the connection or the setting of circuit cells in the inside of the LSI. When a new integration circuit technique other than LSI techniques are realized in the future by an advance in semiconductor technology or related technology, the functional blocks may be realized using such a new technique. A possible example of a new technique is biotechnology.

Figure 7:
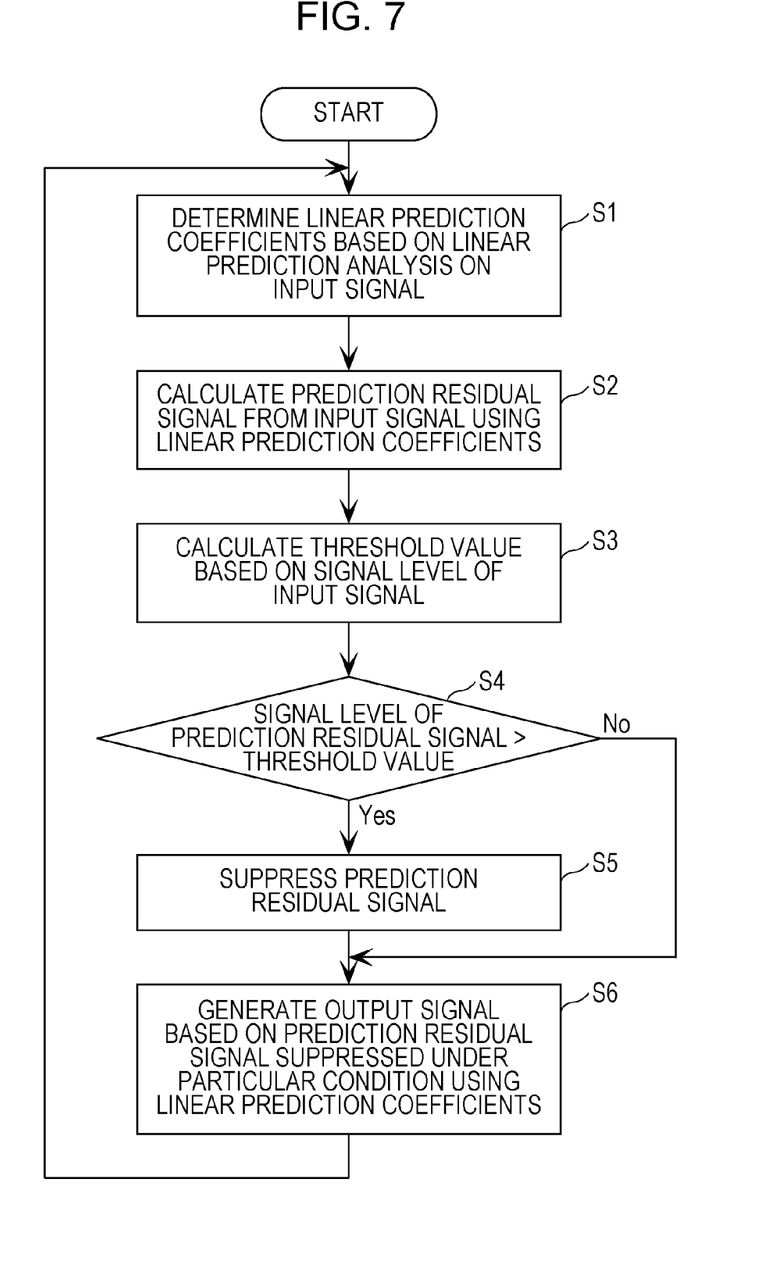
FIG. 7 is a flow chart illustrating an example of a noise suppression process in a noise suppression apparatus.

(4) In an aspect, the present disclosure may provide a noise suppression method including processing steps for realizing the constituent elements of the noise suppression apparatus 10. In an aspect of the present disclosure, the noise suppression process of the noise suppression method may be implemented by a program (a computer program) for causing an apparatus including a process to execute the process. FIG. 7 is a flow chart illustrating an example of a noise suppression process performed by the noise suppression apparatus 10 by executing a program. The noise suppression process implemented by executing the program by a processor in the noise suppression apparatus 10 includes an analysis step S1 in which linear prediction coefficients is derived by linear prediction analysis on an input signal including pulse noise, a residual calculation step S2 in which a prediction residual signal is calculated from the input signal using the linear prediction coefficient, a threshold value calculation steps S3 in which a threshold value is calculated based on a signal level of the input signal, a judgment step S4 in which a signal level of the prediction residual signal is compared with the threshold value, a limit control step S5 in which in a case where a result of the comparing in the judgment step S4 indicates that the signal level of the prediction residual signal is larger than the threshold value, the prediction residual signal is suppressed, and a reproduction step S6 in which an output signal is generated based on the prediction residual signal having been subjected to the suppression in the limit control step S5 using the linear prediction coefficients. Note that in the limit control step S5, in a case where the result of the comparing in the judgment step S4 indicates that the signal level of the prediction residual signal is not larger than the threshold value, the prediction residual signal is not suppressed. The execution order of the processing procedure shown in FIG. 7 is not necessarily limited to the order described above with reference to FIG. 7, but the execution order may be changed, some steps may be executed in parallel, or part of the steps may be removed without departing from the spirit and the scope of the disclosure. In an aspect of the present disclosure, the program described above may be provided in the form of a digital signal. The present disclosure may be implemented by the digital signal stored in the storage medium described above. In an aspect, the present disclosure may be implemented by a computer readable storage medium, such as a flexible disk, a hard disk, a CD-ROM disk, an MO disk, a DVD disk, a DVD-ROM disk, a DVD-RAM disk, a BD (Blu-ray (registered trademark) Disc), a semiconductor memory, or the like in which the computer program or the digital signal are stored. The present disclosure may be implemented by the digital signal stored in the storage medium described above. In an aspect, the present disclosure may be implemented by transmitting the computer program or the digital signal via a telecommunication line, a wired or wireless communication line, a network typified by the Internet, data broadcasting, or the like. In an aspect, the present disclosure may be implemented by a computer system including a microprocessor and a memory, wherein the computer program is stored in the memory and the microprocessor operates according to the computer program. The program or the digital signal may be stored in the storage medium and the storage medium may be transported, or the program or the digital signal may be transferred via the network or the like thereby allowing the present disclosure to be implemented in another computer system.

(5) Any embodiment realized by an arbitrary combination of constituent elements and functions disclosed above in the embodiments and modifications also fall in the scope of the present disclosure.

The present disclosure may be used, for example, to remove noise in a wide variety of systems or apparatuses such as a car radio receiver, a sound collector, an audio device, a video conference system, or the like.

What is claimed is:

1. A noise suppression apparatus for suppressing pulse noise mixed in an input sound signal, the noise suppression apparatus comprising:
a processor;
a memory storing thereon a computer program, which when executed by the processor, causes the processor to perform operations including:
receiving the sound signal with the pulse noise therein into the noise suppression apparatus;
deriving linear prediction coefficients by linear prediction analysis on the input sound signal;
determining a prediction residual signal indicating a difference from a result of the linear prediction, from the input sound signal using the linear prediction coefficients;
determining a threshold value based on a signal level of the input sound signal;
comparing a signal level of the prediction residual signal with the threshold value, and identifying the pulse noise in the input sound signal when the signal level of the prediction residual signal is greater than the threshold value;
performing a limit control on the prediction residual signal depending on a result of the comparison, and suppressing the pulse noise in the input sound signal as a result of performing limit control on the prediction residual signal; and
generating an output sound signal in which the pulse noise is suppressed using the linear prediction coefficients based on the prediction residual signal having been subjected to the limit control; and
a reproducer that reproduces from the output sound signal the input sound signal with the pulse noise suppressed.

2. The noise suppression apparatus according to claim 1, wherein in the limit control, in a case where the result of the comparing indicates that the signal level of the prediction residual signal is larger than the threshold value, the prediction residual signal is suppressed, while in a case where the result of the comparing indicates that the signal level of the prediction residual signal is not larger than the threshold value, the prediction residual signal is not suppressed.

3. The noise suppression apparatus according to claim 2, wherein
the input sound signal is a time-series signal including signal data at each sample point, in the determining of the prediction residual signal, the prediction residual signal is determined as the time-series signal including signal data at each sample point,
in the comparing, in a case where the result of the comparing indicates that the signal level of the prediction residual signal at a first sample point subjected to the comparison is not larger than the threshold value, a second sample point immediately following the first sample point is employed as a next sample point to be subjected to the comparing, while in a case where the result of the comparing indicates that the signal level of the prediction residual signal at the first sample point subjected to the comparison is larger than the threshold value, a third sample point a predetermined number of samples after the first sample point is employed as a next sample point to be subjected to the comparing, and
in the limit control, in a case where the result of the comparing indicates that the signal level of the prediction residual signal at the first sample point subjected to the comparison is larger than the threshold value, the suppression of the prediction residual signal is performed at least at the first sample point and at as many sample points following the first sample point as a number equal to the predetermined number minus 1.

4. The noise suppression apparatus according to claim 3, wherein
the threshold value that is compared, in the comparing, with the signal level of the prediction residual signal at the first sample point is a threshold value determined based on the average value of signal levels at a plurality of successive sample points including the first sample point of the input sound signal.

5. The noise suppression apparatus according to claim 1, wherein in the determining of the threshold value, the threshold value is determined based on the ratio between the signal level of the input sound signal and the signal level of the prediction residual signal.

6. A noise suppression method for suppressing pulse noise mixed in an input sound signal, comprising:
receiving the sound signal with the pulse noise therein into the noise suppression apparatus;
deriving linear prediction coefficients by linear prediction analysis on the input sound signal;
determining a prediction residual signal indicating a difference from a result of the linear prediction, from the input sound signal using the linear prediction coefficients;
determining a threshold value based on a signal level of the input sound signal;
comparing a signal level of the prediction residual signal with the threshold value, and identifying the pulse noise in the input sound signal when the signal level of the prediction residual signal is greater than the threshold value;
performing suppression depending on a result of the comparing such that in a case where the result of the comparing indicates that the signal level of the prediction residual signal is larger than the threshold value, the prediction residual signal is suppressed, while in a case where the result of the comparing indicates that the signal level of the prediction residual signal is not larger than the threshold value, the prediction residual signal is not suppressed;
generating an output sound signal in which the pulse noise is suppressed based on the prediction residual signal having been subjected to the suppression using the linear prediction coefficient; and
reproducing, with a reproducer, from the output sound signal, the input sound signal with the pulse noise suppressed.

7. A non-transitory computer readable medium storing a computer program instructing a processor of a computer to perform a method for suppressing pulse noise mixed in an input sound signal, which when executed by the processor of the computer, causes the processor to perform operations including:
receiving the sound signal with the pulse noise therein into the noise suppression apparatus;
deriving linear prediction coefficients by linear prediction analysis on the input sound signal;
determining a prediction residual signal indicating a difference from a result of the linear prediction, from the input sound signal using the linear prediction coefficients;
determining a threshold value based on a signal level of the input sound signal;
comparing a signal level of the prediction residual signal with the threshold value, and identifying the pulse noise in the input sound signal when the signal level of the prediction residual signal is greater than the threshold value;

performing suppression depending on a result of the comparing such that in a case where the result of the comparing indicates that the signal level of the prediction residual signal is larger than the threshold value, the prediction residual signal is suppressed, while in a case where the result of the comparing indicates that the signal level of the prediction residual signal is not larger than the threshold value, the prediction residual signal is not suppressed; and generating an output sound signal in which the pulse noise is suppressed based on the prediction residual signal having been subjected to the suppression using the linear prediction coefficient; and reproducing, with a reproducer, from the output sound signal, the input sound signal with the pulse noise suppressed.

* * * * *